United States Patent
Wolas

(10) Patent No.: US 10,052,985 B2
(45) Date of Patent: Aug. 21, 2018

(54) LIQUID COOLED THERMOELECTRIC DEVICE

(71) Applicant: Gentherm Incorporated, Northville, MI (US)

(72) Inventor: Scott Wolas, Newbury Park, CA (US)

(73) Assignee: GENTHERM INCORPORATED, Northville, MI (US)

( * ) Notice: Subject to any disclaimer, the term of this patent is extended or adjusted under 35 U.S.C. 154(b) by 26 days.

(21) Appl. No.: 15/128,287

(22) PCT Filed: May 1, 2015

(86) PCT No.: PCT/US2015/028764
§ 371 (c)(1),
(2) Date: Sep. 22, 2016

(87) PCT Pub. No.: WO2015/171453
PCT Pub. Date: Nov. 12, 2015

(65) Prior Publication Data
US 2018/0170223 A1 Jun. 21, 2018

Related U.S. Application Data
(60) Provisional application No. 61/989,063, filed on May 6, 2014.

(51) Int. Cl.
*H05K 7/20* (2006.01)
*B60N 2/56* (2006.01)
(Continued)

(52) U.S. Cl.
CPC ....... *B60N 2/5678* (2013.01); *B60H 1/00328* (2013.01); *B60H 1/00457* (2013.01);
(Continued)

(58) Field of Classification Search
None
See application file for complete search history.

(56) References Cited

U.S. PATENT DOCUMENTS 6,119,463 A * 9/2000 Bell ................... B60H 1/00471
165/86
6,223,539 B1 5/2001 Bell
(Continued)

FOREIGN PATENT DOCUMENTS

| CN | 102444943 A | 5/2012 |
| DE | 102006001304 A1 | 7/2007 |

(Continued)

OTHER PUBLICATIONS

ISR and Written Opinion from the European Patent Office for App. No. PCT/US2015/028764, dated Sep. 11, 2015.
(Continued)

*Primary Examiner* — Courtney Smith
(74) *Attorney, Agent, or Firm* — The Dobrusin Law Firm, P.C.; Daniel P. Aleksynas

(57) ABSTRACT

A temperature conditioning module 6 having an integrated waste heat cooling circuit, comprising; a housing 10 having at least one air inlet 12 and a first 16 and second 20 spaced apart air outlets, one or more motor driven impellers 40A, 40B, one or more fluid recirculation pumps 52: one or more thermoelectric devices 80 that is located in the first passage 14 of the housing between the one or more motor driven impellers and the first air outlet 16, one or more heat exchangers 54 that is located in the second passage 18 of the housing, between the at least one motor driven impeller and the second air outlet 20; and a fluid circulation circuit 50 that is contained entirely within the housing, and passing fluid in thermal communication with the waste side of the one or more thermoelectric devices 80 to thereby absorb at least a
(Continued)

portion of the waste heat and then to expel it to the heat exchanger 54.

19 Claims, 7 Drawing Sheets

(51) Int. Cl.
   *B60H 1/00* (2006.01)
   *B60H 1/32* (2006.01)

(52) U.S. Cl.
   CPC ..... *B60H 1/00564* (2013.01); *B60H 1/00571* (2013.01); *H05K 7/20327* (2013.01); *H05K 7/20409* (2013.01); *B60H 2001/00614* (2013.01); *B60H 2001/3289* (2013.01)

(56) References Cited

U.S. PATENT DOCUMENTS

| | | | |
|---|---|---|---|
| 6,226,994 B1 | 5/2001 | Yamada et al. | |
| 6,907,739 B2 * | 6/2005 | Bell | B60H 1/00471 62/3.3 |
| 7,059,137 B2 * | 6/2006 | Childress | B60H 1/00264 62/259.2 |
| 7,587,901 B2 | 9/2009 | Petrovski | |
| 7,966,835 B2 | 6/2011 | Petrovski | |
| 8,490,412 B2 * | 7/2013 | Bell | F24F 5/0042 62/259.3 |
| 9,306,143 B2 * | 4/2016 | Ranalli | H01L 35/30 |
| 9,365,090 B2 * | 6/2016 | Gawthrop | B60H 1/004 |
| 9,650,940 B2 * | 5/2017 | Kakehashi | B60H 1/00885 |
| 9,744,827 B2 * | 8/2017 | Nishikawa | F01P 3/20 |
| 9,890,975 B2 * | 2/2018 | Zelissen | F25B 21/04 |
| 2006/0237164 A1 * | 10/2006 | Bouchalat | B60H 1/00028 165/42 |
| 2007/0101729 A1 * | 5/2007 | Aoki | B60H 1/00285 62/3.61 |
| 2008/0173022 A1 | 7/2008 | Petrovski | |
| 2011/0061400 A1 | 3/2011 | Park et al. | |
| 2011/0061402 A1 | 3/2011 | Jun et al. | |
| 2012/0079835 A1 | 4/2012 | Oh et al. | |
| 2012/0192574 A1 | 8/2012 | Ghoshal et al. | |
| 2012/0305043 A1 | 12/2012 | Kossakovski et al. | |
| 2013/0059190 A1 | 3/2013 | Kossakovski et al. | |
| 2013/0104953 A1 | 5/2013 | Poliquin et al. | |

FOREIGN PATENT DOCUMENTS

| | | |
|---|---|---|
| JP | H10000922 A | 1/1998 |
| JP | 2002-125801 A | 5/2002 |
| JP | 2006-137405 A | 6/2006 |
| JP | 2011-063257 | 3/2011 |

OTHER PUBLICATIONS

IPRP from the European Patent Office for App. No. PCT/US2015/028764, dated Apr. 19, 2016.
Office Action from the Japanese Patent Office for Application No. 2016-562010, dated Mar. 28, 2017.
Office Action from the Chinese Patent Office for Application No. 2015-80021008.9, dated Apr. 26, 2018.

* cited by examiner

LIQUID COOLED THERMOELECTRIC DEVICE

FIELD

The present teachings generally relate to a thermoelectric device including an integrated liquid cooling system.

BACKGROUND

The present teachings are predicated upon providing improved removal of waste heat from a thermoelectric device. Current systems move air over a waste side of a thermoelectric device so that waste air is removed from the system. Removal of waste temperature using the flow of air is sufficient to create conditioned air. However, attempts have been made to use a liquid to cool the thermoelectric device to improve the removal of waste temperature (e.g., heat). These liquid tubes may burst and fluid may leak into a component such as a vehicle seat. The liquid tubes may further be subject to puncture or cutting by internal components of a vehicle seat and/or the installation process such that when the system is activated fluid may leak within the vehicle seat. Leaking of the fluid from the system may inhibit removal of waste heat from the system and operation of the system may be less than optimal and is undesirable to a user.

In addition, the liquid tubes may be kinked and/or crushed by movement of the seat, the occupant, or both so that fluid flow through the system is inhibited and/or prevented and the removal of waste heat is substantially reduced and/or prevented. Further, the liquid cooling systems have to be charged and/or filled at the assembly plant and/or during assembly so that the system may be installed and connected together during assembly. Due to the potential of leaking and decreased performance liquid cooling systems have not readily been used in automotive applications.

Examples of cooling of thermoelectric electric devices may be found in U.S. Pat. Nos. 6,226,994, 7,587,901, and 7,966,835; and U.S. Patent Application Publication Nos. 2012/0192574 and 2013/0059190; all of which are incorporated by reference herein in their entirety for all purposes.

It would be attractive to have a closed loop liquid system that removes waste heat. It would be attractive to have a liquid loop that is integrated into and/or part of a housing for the climate control system. What is needed is a system that can be charged before installation so that the climate control system can be installed without the installer having to charge the system and/or fill the system during assembly. What is needed is a system that is free of a liquid connection and only includes an electrical connection.

SUMMARY

The present teachings meet one or more (if not all) of the present needs by providing, a temperature conditioning module having an integrated waste heat cooling circuit, comprising: a housing having at least one air inlet and a first and second spaced apart air outlets, the first and second spaced apart air outlets defining terminal portions of respective first and second independent air passages; one or more motor driven impellers supported for rotation within the housing, the one or more motor driven impellers being in fluid communication with the at least one air inlet and one or both of the first and second air passages; one or more fluid recirculation pumps; one or more thermoelectric devices that is located in the first passage of the housing between the one or more motor driven impellers and the first air outlet, the at least one thermoelectric device having a first main side and a second waste side and being adapted to generate a temperature gradient between the first main side and the second waste side upon application of a source of electricity; one or more heat exchangers that is located in the second passage of the housing, between the at least one motor driven impeller and the second air outlet; and a fluid circulation circuit that is (i) contained entirely within the housing, (ii) forms part of the housing or both (i) and (ii); the fluid circulation circuit being in fluid communication with the one or more fluid recirculation pump and passing fluid in thermal communication with the second waste side of the one or more thermoelectric devices to thereby absorb at least a portion of the waste heat provided by the second side, and then passing the fluid in thermal communication with the one or more heat exchangers to expel the portion of the waste heat to the heat exchanger before returning the fluid to the one or more fluid recirculation pumps for subsequent recirculation; and wherein the one or more motor driven impellers is operable so that (i) air from the at least one air inlet is directed through the first passage in the housing and exits the first outlet after passing over the first main side of the one or more thermoelectric devices; and (ii) air from the at least one air inlet is directed through the second passage in the housing and exits the second outlet after passing over the one or more heat exchangers.

The teachings herein surprisingly solve one or more of these problems by providing a closed loop liquid system that removes waste heat. The teachings herein provide a liquid loop that is integrated into and/or part of a housing for the climate control system. The teachings herein provide a system that can be charged before installation so that the climate control system can be installed without the installer having to charge the system and/or fill the system during assembly. The teachings herein provide a system that is free of a liquid connection and only includes an electrical connection.

DETAILED DESCRIPTION

Figure 1:
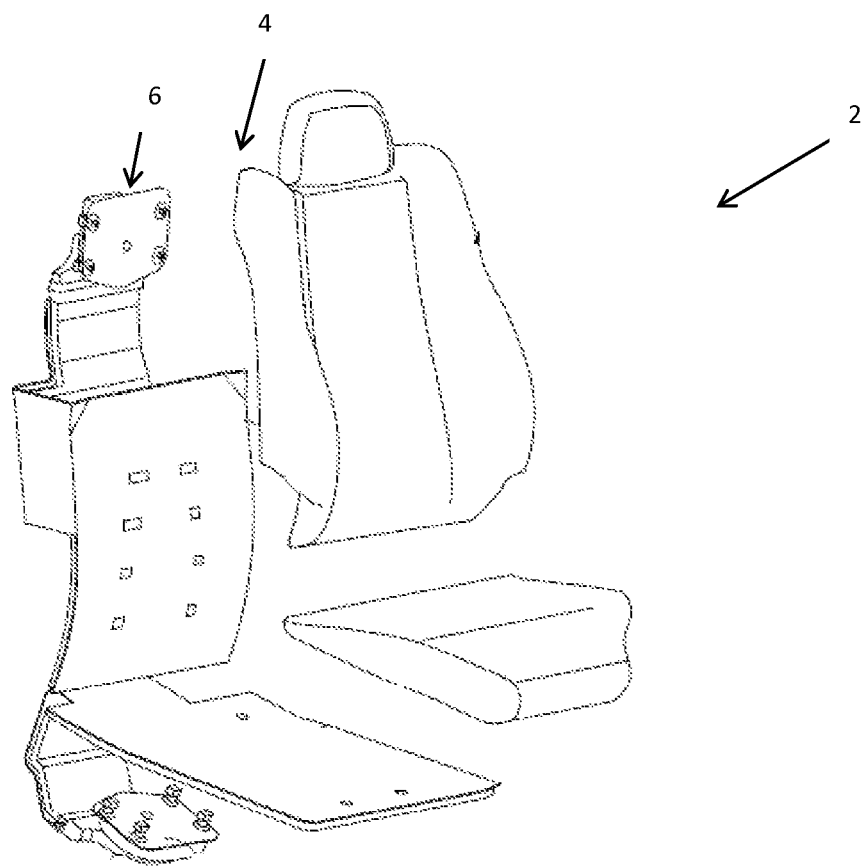
FIG. 1 illustrates a vehicle seat including a ventilation system with a temperature conditioning module.

The explanations and illustrations presented herein are intended to acquaint others skilled in the art with the invention, its principles, and its practical application. Those skilled in the art may adapt and apply the teachings in its numerous forms, as may be best suited to the requirements of a particular use. Accordingly, the specific embodiments of the present teachings as set forth are not intended as being exhaustive or limiting of the teachings. The scope of the teachings should, therefore, be determined not with reference to the above description, but should instead be determined with reference to the appended claims, along with the full scope of equivalents to which such claims are entitled. The disclosures of all articles and references, including patent applications and publications, are incorporated by reference for all purposes. Other combinations are also possible as will be gleaned from the following claims, which are also hereby incorporated by reference into this written description.

The device of the present teachings may be integrated into one or more articles of manufacture. The device may provide cooling and/or heating to an article of manufacture, a user of an article of manufacture, or both. The device may provide transfer of and/or removal of thermal energy. The article of manufacture may be an automotive component, a household component, or both. Preferably, the article of manufacture is a vehicle seat. The article of manufacture may be a bed, a chair, a couch, a cooling pad, or a combination thereof. The article of manufacture may include and/or be connected to a climate control system.

The climate control system may function to provide cooling, provide heating, or both. The climate control system may condition air and move the air towards an occupant and/or user. The climate control system may include one or more air distribution devices, one or more channels, one or more bags, one or more fluid permeable layers, one or more occupant contact surface areas, or a combination thereof. The climate control system may include a heater and air mover.

The heater may be any heater that functions to produce heat. The heater may be a lay wire, carbotex, resistive (e.g., Positive Temperature Coefficient heater), or a combination thereof. The heater may be connected to a trim layer of a vehicle seat, to a climate control system, or both. The heater may be placed over a foam cushion of a seat and under a trim layer. The heater may be used in conjunction with a temperature control module.

The temperature control module may function to move air, move conditioned air, heat an occupant and/or user, cool an occupant and/or user, or a combination thereof. The temperature control module may provide a cooling effect. The temperature control module may include a thermoelectric device, a Peltier device, or both. Preferably, the temperature control module may provide thermal energy to an air stream that is moved into contact with an occupant. For example, cooled air may be blown on an occupant of a vehicle seat or an occupant of a couch. The temperature control module may include one or more housings.

The one or more housings may function to protect components of the temperature control housing (e.g., fluid lines, thermoelectric devices, impellers). The one or more housings may function to create a single package that needs to be installed into a seat. The one or more housings may include one or more air inlets, one or more air outlets, one or more air passages, one or more vents, one or more fluid lines, or a combination thereof. The one or more housings may include channels for the passage of fluid. The housing may function to hold, protect, house, provide a single package, or a combination thereof that integrates all of the components of the temperature control module together. The housing may be made of a rigid material. The housing may be made of plastic. The housing may be puncture resistant. The housing may be made of nylon, delrin, acrylonitrile butadiene styrene, polypropylene, polyethylene, vinyl, polycarbonate, thermoplastic elastomers, acrylic, or a combination thereof. The housing may include at least one air inlet and two air outlets.

The air outlets may function to permit movement of conditioned air towards an occupant, a user, or both. The air outlets may function to allow for removal of waste air from the system. The air outlets may connect to one or more conduits, extensions, tails, passages, or a combination thereof so that conditioned air, waste air, or both may be removed from the temperature control module and moved to a desired location (e.g., a distribution bag in a seat). Preferably, the housing includes at least a first air passage having a first air outlet and a second air passage having a second air outlet. The air outlets, the housing, or both may include one or more vents.

The one or more vents may function to circulate air, prevent laminar air flow, prevent dead spots, move air through the housing, move air through a passage, move air through the temperature control module, or a combination thereof. The one or more vents may allow for air to be moved within the housing without being introduced through the inlet. The one or more vents may prevent a negative pressure from being created within the housing. The one or more vents may be angled so that air is moved in a specific direction, the one or more vents may be substantially perpendicular to a wall of a housing, or both. The one or more vents, one or more air passages, one or more outlets, one or more inlets, or a combination thereof may be in fluid communication with one or more impellers, one or more air movers, one or more blowers, or a combination thereof.

The one or more impellers function to move air through the temperature control module, the housing, the air passages, the vents, or a combination thereof. The impeller may be part of a blower, an air mover, or both. The impeller is motor driven. The impeller may be directly, indirectly, or both connected to a motor. Multiple impellers may be connected to a single motor. For examiner a single motor may drive two or more impellers. Each motor may drive one or more impellers, two or more impellers, or even three or more impellers. A differential may be located between the motor and two or more impellers to distribute power between the two or more impellers. The motor may drive two or more impellers at the same speed, at different speeds, or both. The motor may selectively drive the two or more impellers. The impellers may be made of plastic, metal, or a combination of both. The impellers may include a plurality of fins that move air. The one or more impellers may radially move air. The one or more impellers may be a waste impeller and a main impeller.

The main impeller may function to move conditioned air towards an occupant, towards a user, or both. The main impeller may move air through a first passage, a second passage, or both. Preferably, the main impeller only moves air through a first passage. The main impeller may be adjacent to a waste impeller. The main impeller may remove waste air. The air flow generated by the main impeller may be channeled towards an occupant and some of the air flow may be channeled to create a waste stream. The distribution of air flow may be controlled by channeling and/or passages located in the housing. The main impeller may be located on a first side of a housing and a waste impeller may be located on a second side of a housing.

The waste impeller may function to remove waste from the temperature control module. Preferably, the waste impeller removes waste heat from the temperature control module. The waste impeller may move air through one or more air passages, one or more outlets, one or more vents, or a combination thereof. The waste impeller may move a fluid across a heat exchanger so that fluid of a system is cooled. The waste impeller, the main impeller, or both may be part of and/or discrete from the fluid circulation circuit. The waste impeller, the main impeller, or both may be the same device and/or connected to the same motor. The waste impeller, the main impeller, or both may work in conjunction with the fluid circulation circuit.

The fluid circulation circuit may function to remove heat from the system by circulating a fluid medium throughout the temperature control module. The fluid circulation circuit may be totally enclosed within the housing. The fluid circulation circuit may extend through the housing, between two or more pieces of housing, or both. The fluid circulation circuit may be encased within a portion of the housing, part of the housing, be connected to the housing, or a combination thereof. The fluid circulation circuit may include a plurality of discrete lines that are connected together. The fluid circulation circuit may be an integral part of the housing. The fluid circulation circuit may include and/or be a closed loop. The fluid circulation circuit may remove waste heat, waste cool, or both. The fluid circulation circuit may include one or more pumps.

The one or more pumps may circulate the fluid medium. The one or more pumps may intermittently circulate the fluid medium, continuously circulate the fluid medium, or both. The one or more pumps may move the fluid medium through a heat exchanger, through a fluid line, through a thermoelectric device, through a thermal transfer plate, or a combination thereof. The one or more pumps may be in a location where the fluid medium is always a liquid (e.g., after a waste heat exchanger). The one or more pumps may move a liquid, a gas, or a combination of both. The one or more pumps may compress a gas so that the gas may be pumped. The one or more pumps may be a positive displacement pump, a gear pump, screw pump, progressing cavity pump, peristaltic pump, plunger pump, or a combination thereof. The one or more pumps may circulate enough fluid so that the system achieves a steady state condition where waste thermal energy is efficiently removed. Preferably, the one or more pumps recirculate the fluid medium so that fluid is continuously recirculated through one or more heat exchangers.

The one or more heat exchangers may remove waste thermal energy from the system, import thermal energy into the fluid medium, or both. The one or more heat exchangers may function to change the temperature of the fluid medium. The one or more heat exchangers preferably remove waste heat from the fluid medium. The one or more heat exchangers may include a plurality of fins for removing thermal energy and/or introducing thermal energy. The plurality of fins may transfer thermal energy from a liquid to a gas so that the temperature of the liquid changes. The one or more heat exchangers may be in direct contact with the fluid medium, in direct contact with the fluid medium, or a combination of both. The system may include one or more heat exchangers, preferably two or more heat exchangers, or even three or more heat exchangers. The heat exchangers may function to remove heat from a thermoelectric device, a peltier device, or both. The heat exchangers may include one or more thermal transfer plates. The heat exchangers may include one or more fluid transfer lines so that fluid is moved through the heat exchangers. The heat exchangers may allow for passage of the fluid medium in one portion and air from the one or more impellers in another portion so that heat and/or cool is removed from the system via the one or more heat exchangers. The heat exchangers, fluid lines feeding the heat exchangers, or both may be entirely located within the housing, protected by the housing, connected to the housing, or a combination thereof. The one or more heat exchangers may be connected to the housing. The one or more heat exchangers may be connected to the housing by one or more fasteners, friction fit, interference fit, being molded into the housing, or a combination thereof. Preferably, a plurality of screws connect the heat exchanger and the housing. The one or more heat exchangers may be connected to and/or include one or more thermal transfer plates.

The one or more thermal transfer plates may function to remove temperature (e.g., cool and/or heat) and/or thermal energy so that the temperature and/or thermal energy may be removed from the system, moved to another location within the system, or both. The one or more thermal transfer plates may function to introduce thermal energy into the fluid transfer medium. The one or more thermal transfer plates may be in direct contact with the fluid transfer medium. The one or more thermal transfer plates may include baffles, fins, or both to assist in thermal transfer. The one or more thermal plates may be in contact on one or more sides with a heat exchanger, a thermoelectric device, a peltier device, or a combination thereof. The one or more thermal transfer plates may be connected to a heat exchanger, thermoelectric device, pettier device, or a combination thereof via a thermal glue, a thermal paste, a fastener, conductive adhesive, a thermal grease, solder, or a combination thereof. The one or more thermal transfer plates may be connected to the housing via friction fit, a fastener, an interference fit, a compression fit, or a combination thereof. The one or more thermal transfer plates may be connected within the housing by being connected to the thermal transfer lines. A housing cover may sandwich the thermal transfer plate within the housing. The one or more thermal transfer plates may include one or more fluid lines for introducing and/or removing fluid transfer medium from the thermal transfer plates.

The one or more thermal transfer lines may function to move a fluid transfer medium between the heat exchanger, the thermoelectric device, peltier device, pump, or a combination thereof. The one or more thermal transfer lines may function to remove thermal energy from an application location and move the thermal energy to a waste location where the thermal energy is removed from the system. The one or more thermal transfer lines may be discrete lines that are placed within the housing. The one or more thermal transfer lines may be connected to the housing. The one or more thermal transfer lines may be an integral part of the housing. The one or more thermal transfer lines may be discrete from the housing but the housing may connect two or more of the thermal transfer lines together to form a circuit. The one or more thermal transfer lines may be partially located within the housing, partially be part of the housing, partially located outside of the housing, or a combination thereof. Preferably, the one or more thermal transfer lines may be entirely located within the housing. When the thermal transfer lines are entirely located within the housing, a portion of the fluid transfer lines may be exposed in order to fill the thermal transfer lines.

The one or more thermal transfer lines may be one or more waste heat lines. The waste heat lines may provide fluid medium between the thermoelectric device and the heat exchanger, the pettier device and the heat exchanger, or both. The one or more waste lines may move thermal energy from an application location (i.e., a location where conditioned air is moved towards a user) to a waste location. The one or more waste lines may function to transfer unwanted thermal energy to a location where the unwanted thermal energy may be removed from the system. T The one or more thermal transfer lines may be a recirculation line. The recirculation line may extend from the heat exchanger to one or more pumps so that the pumps may circulate the cooled fluid medium throughout the system. The one or more thermal transfer lines may be a cooling line. The cooling line may extend from the pump to the thermoelectric device, the peltier device, or both. The one or more thermal transfer lines may include one or more fill ports, one or more evacuation ports, one or more charging ports, or a combination thereof.

The one or more thermal transfer lines may be free of fill ports, evacuation ports, charging ports, or a combination thereof. The one or more fill ports may be a single fill port and once filling is complete the fill port may permanently seal. The one or more fill ports may be reusable. The one or more fill ports, one or more fluid transfer lines, or both may include and/or be in communication with a fluid transfer medium reservoir. The one or more reservoirs may maintain a constant pressure within the fluid transfer lines upon a phase change of the fluid transfer medium. The one or more reservoirs may create an overflow upon heating of the fluid transfer medium and add additional fluid transfer meeting when the fluid transfer medium is cold. The one or more reservoirs may be located within a thermal transfer line, proximate to a thermal transfer line, be part of a thermal transfer line, or a combination thereof.

The one or more thermal transfer lines may be made of any material that is resistant to the fluid transfer medium, that assists in the transfer of heat, that may be subjected to fluid pressure without being damaged, or a combination thereof. The fluid transfer lines may be made of a natural material, a synthetic material, a thermoplastic, a plastic, nylon, acrylonitrile butadiene styrene (ABS), polyvinyl chloride (PVC), polypropylene (PP), polyethylene (PE), polyvinylidene fluoride (PVDF), or a combination thereof. The fluid transfer medium may function to remove heat and/or cool from the system.

The fluid transfer medium may function to rapidly receive and release heat, cool, or both. The fluid transfer medium may be water, glycol, ethylene glycol, diethylene glycol, propylene glycol, coolant, glycerol, or a combination thereof. The fluid transfer medium may be sufficiently viscous that the fluid flows. The fluid transfer medium may be pumpable. The fluid transfer medium may not undergo a phase change when receiving heat, releasing heat, or both. The fluid transfer medium may undergo a phase change (e.g., go from a liquid to vapor and then back to a liquid). The fluid transfer medium may undergo a phase change in the heating configuration, the cooling configuration, or both. The fluid transfer medium may be in a sealed line that prevents the escape of any fluid transfer medium so that upon a phase change the fluid transfer medium is moved through the lines. The fluid transfer medium may pass through and/or proximate to a thermoelectric device, a thermal transfer plate in communication with a thermoelectric device, or a combination thereof.

The thermoelectric device may function to generate heat, generate cool, or both. The thermoelectric device may be connected within the system by being connected to the housing, the thermal transfer plate, or both. The one or more thermoelectric devices may be connected to the fluid transfer lines and the fluid transfer lines may assist in connecting the thermoelectric device within the housing. The thermoelectric device may be directly connected to the housing via one or more fasteners. The thermoelectric device may be connected to the thermal transfer plate and the thermal transfer plate may be connected to the housing via one or more fasteners. The thermoelectric device may have a main side, a waste side, or both. The thermoelectric device may condition air when air is moved across the main side of the thermoelectric device. The thermoelectric device may include one or more fins for transferring heat, cool, or both. Some examples of thermoelectric devices that may be used with the teachings herein include those taught in U.S. Pat. Nos. 6,119,463 and 6,223,539 and U.S. Patent Application No. 2008/0173022; 2012/0305043; and 2013/0104953 all of which are incorporated by reference herein in their entirety for all purposes. The thermoelectric device, fluid transfer plates, thermal transfer lines, or a combination thereof may include one or more thermal barriers.

The one or more thermal barriers may prevent the transfer of thermal energy to the thermal transfer fluid after the fluid is heated and/or cooled. The one or more thermal barriers may prevent thermal energy from being transferred to ambient, being transferred upon air movement within the housing, or both. One or more thermal barriers may be in a location such that unwanted thermal energy is not transferred to an occupant. The one or more thermal barriers may be insulation. The one or more thermal barriers may be noise barriers, vibration barriers, or both. The one or more thermal barriers may insulate from heat exchange, vibration, sound, or a combination thereof.

FIG. 1 illustrates an example of a vehicle seat 2 including a climate control system 4. The climate control system 4 includes a temperature control module 6 that is connected to the climate system 4 for providing conditioning to an occupant of the vehicle seat 2.

Figure 2:
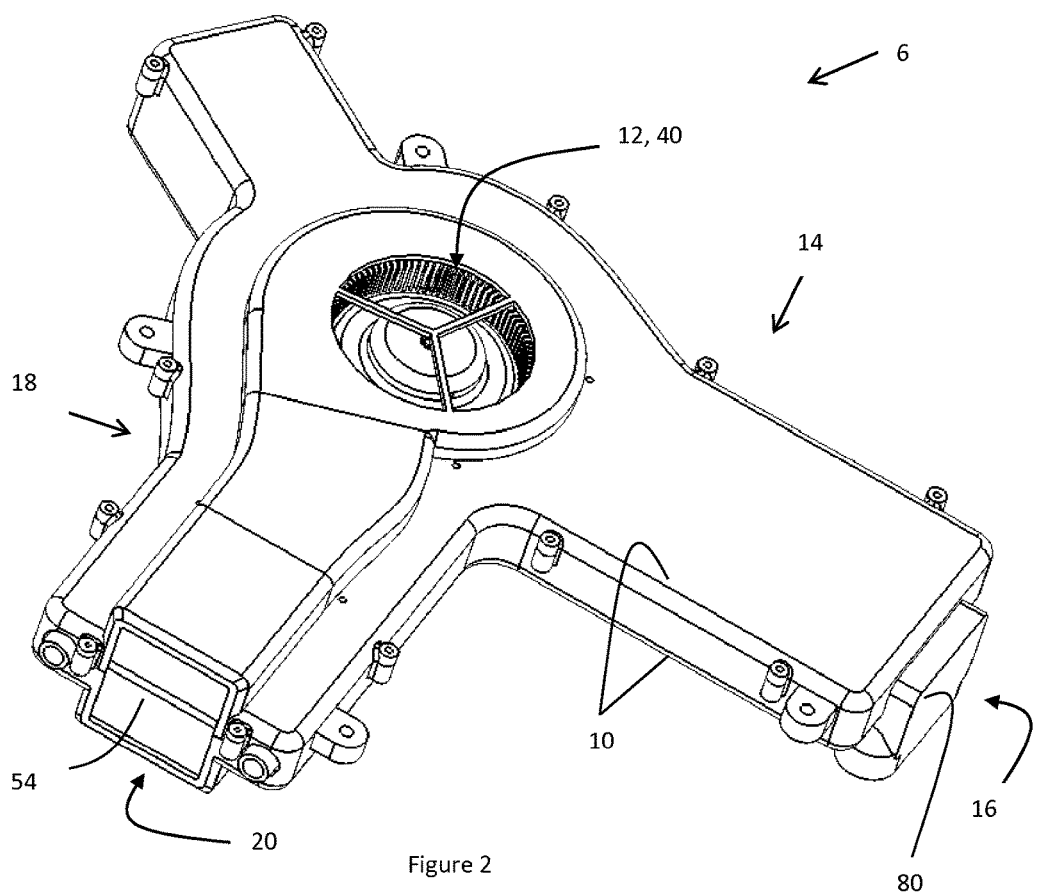
FIG. 2 illustrates a perspective view of a temperature conditioning module.

FIG. 2 illustrates an example of a temperature control module 6. The temperature control module 6 includes a housing 10 with an air inlet 12, a first air passage 14 with a first air outlet 16, and a second air passage 18 with a second air outlet 20. The air inlet 12 allows air to be pulled in the housing 10 by an impeller 40 and then moved through the first air passage 14 over the thermoelectric device 80 and out the first air outlet 16. Air is also is pulled into the housing 10 through the air inlet 12 and an impeller 40 moves the air through the second air passage 18 over a heat exchanger 54 and out the second air outlet 20.

Figure 3:
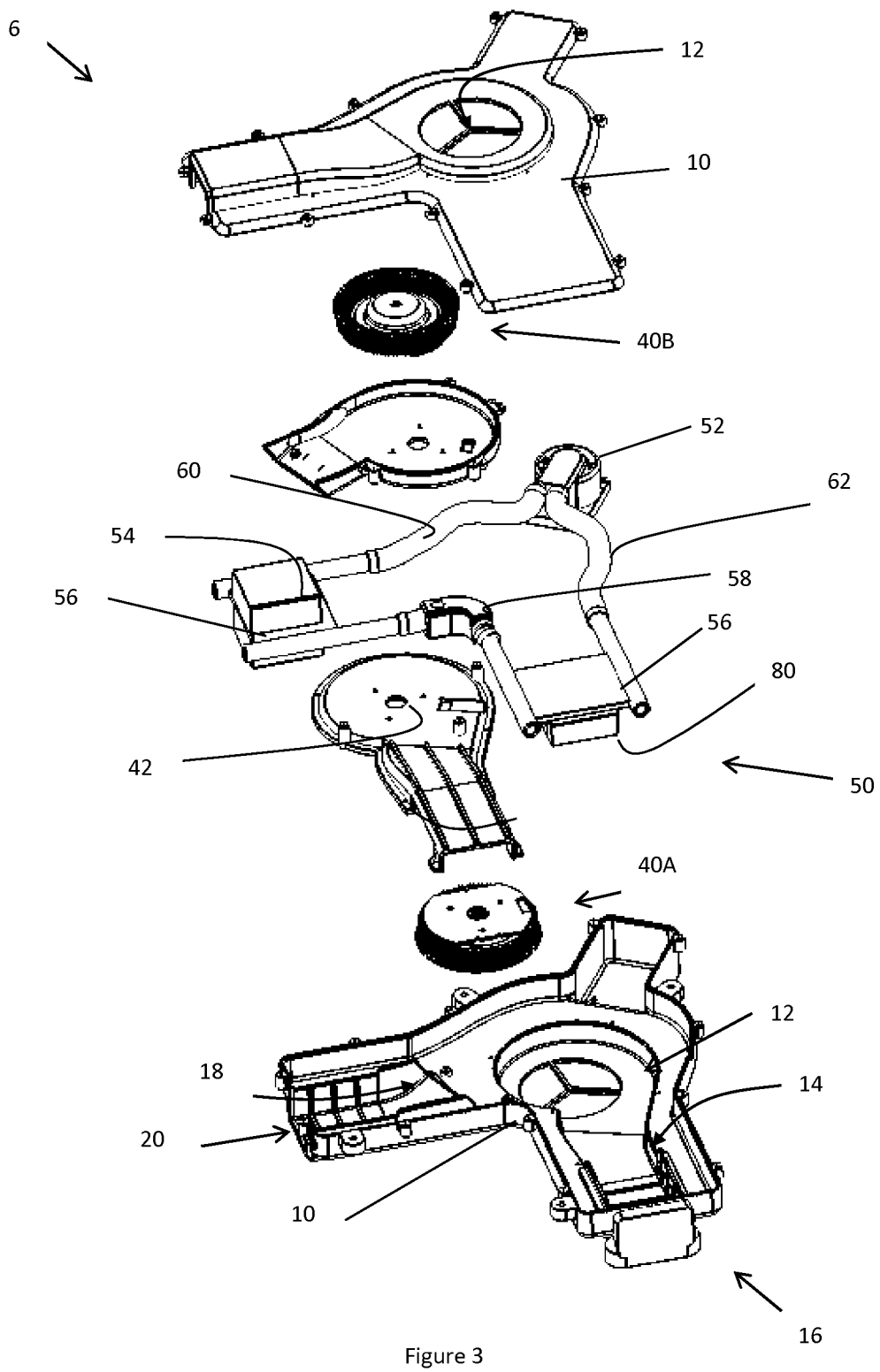
FIG. 3 illustrates an exploded view of a temperature conditioning module.

FIG. 3 illustrates an exploded view of an example of a temperature control module 6. The temperature control module 6 has a top housing 10 with an air inlet 12 that feeds air to a waste impeller 40B. The waste impeller 40B moves air through the second air passage 18 over the heat exchanger 54 and out the second air outlet 20 so that heat is removed from the temperature control module 6. The temperature control module 6 has a bottom housing 10 with an air inlet 12 that feeds air to the main impeller 40A. The main impeller 40A moves air through the first air passage 14 over the thermoelectric device 80 and out the first air outlet 16 so that the air conditioned by the thermoelectric device 80 cools and/or heats an occupant. The main impeller 40A and the waste impeller 40B are back to back so that two discrete air streams are created. Both the main impeller 40A and waste impeller 40B include a motor 42 that rotates the impellers to create air flow. The thermoelectric device 80 is in contact with a thermal transfer plate 56 that includes a fluid to assist in removing heat from the thermoelectric device 80. The fluid is heated by the thermoelectric device 80 and the heated fluid is moved through a waste heat line 58 to a heat exchanger 54 that includes a thermal transfer plate 56, which is located between two portions of the heat exchanger. Air is moved over the heat exchanger 54 and the heat in the fluid is released into the atmosphere and the cooled fluid is moved through a recirculation line 60 to a pump that moves and recirculates the fluid to the thermoelectric device 80 through a cooling line 62 so that the process is repeated.

Figure 4:
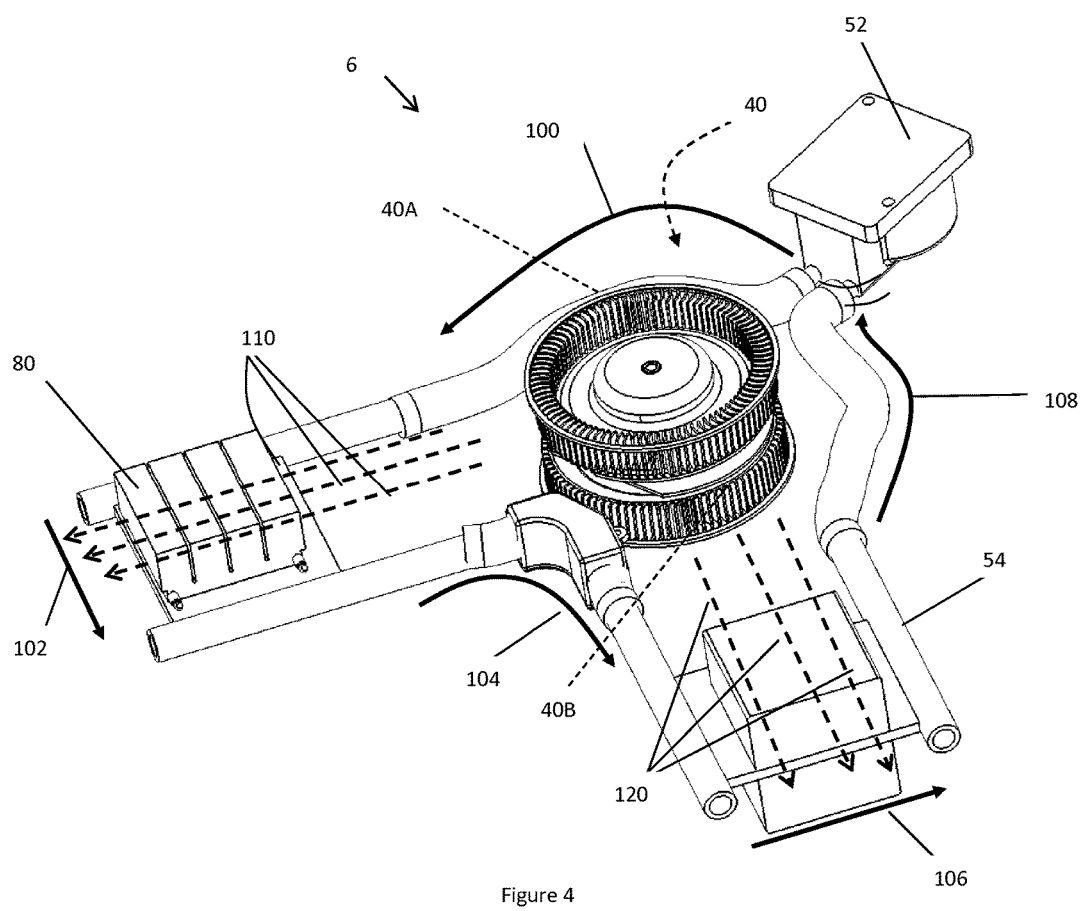
FIG. 4 illustrates flow of fluid through the temperature conditioning module.

FIG. 4 illustrates the fluid paths of the temperature control module 6 with the housing removed. The temperature control module 6 includes a pair of motor driven impellers 40. A main impeller 40A moves air in the direction 110 over the thermoelectric device 80 so that conditioned air is moved to a desired location such as a vehicle seat. A waste impeller 40B moves air in the direction 120 over a heat exchanger 54 so that waste heat generated by the thermoelectric device 80 is removed from the temperature control module 6. A fluid is circulated throughout the temperature control module 6 to remove waste heat. The fluid is moved from a pump 52 in the direction 100 and through the thermoelectric device 80 in the direction 102. From the thermoelectric device 80 the fluid is moved in the direction 104 to the heat exchanger 54 and through the heat exchanger in the direction 106. From the heat exchanger 54 the fluid is moved in the direction 108 to the pump 54 where the fluid is recirculated.

Figure 5:
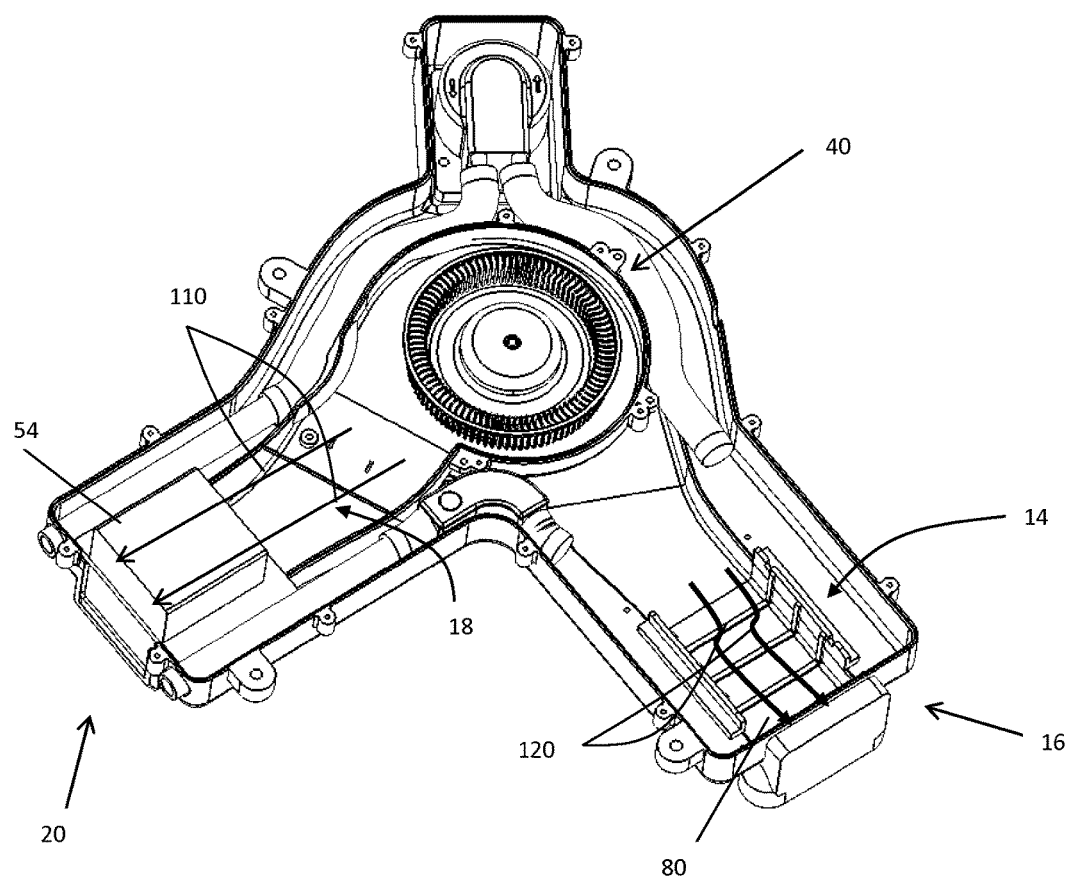
FIG. 5 illustrates the flow of fluid through a housing of the temperature conditioning module.

FIG. 5 illustrates an example of a temperature control module 6 with a single impeller 40 where the air stream is split between the first air passage 14 and the second air passage 18. Part of the air stream moves in the direction 110 over the heat exchanger 54 and out the second air opening 20 where heat is removed. The other portion of the air stream is moved in the direction 120 where the air stream drops down in a second direction and then flows over the thermoelectric device 80 (not shown) to transport conditioned air to a desired location.

Figure 6:
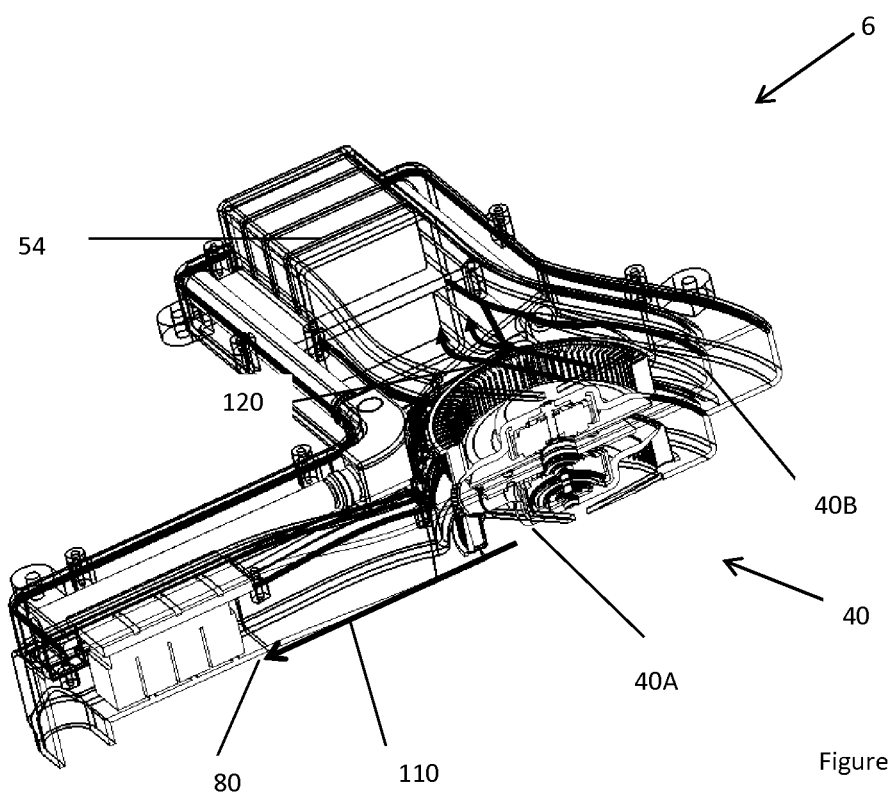
FIG. 6 illustrates a cross-sectional view of the temperature conditioning module.

FIG. 6 illustrates a cross sectional view of a temperature control module 6 include two impellers 40. The main impeller 40A and the waste impeller 40B are fluidly isolated. The fluid from the main impeller 40A moves in the direction 110 over the thermoelectric device 80 and the fluid from the waste impeller 40B moves in the direction 120 past the heat exchanger 54.

Figure 7:
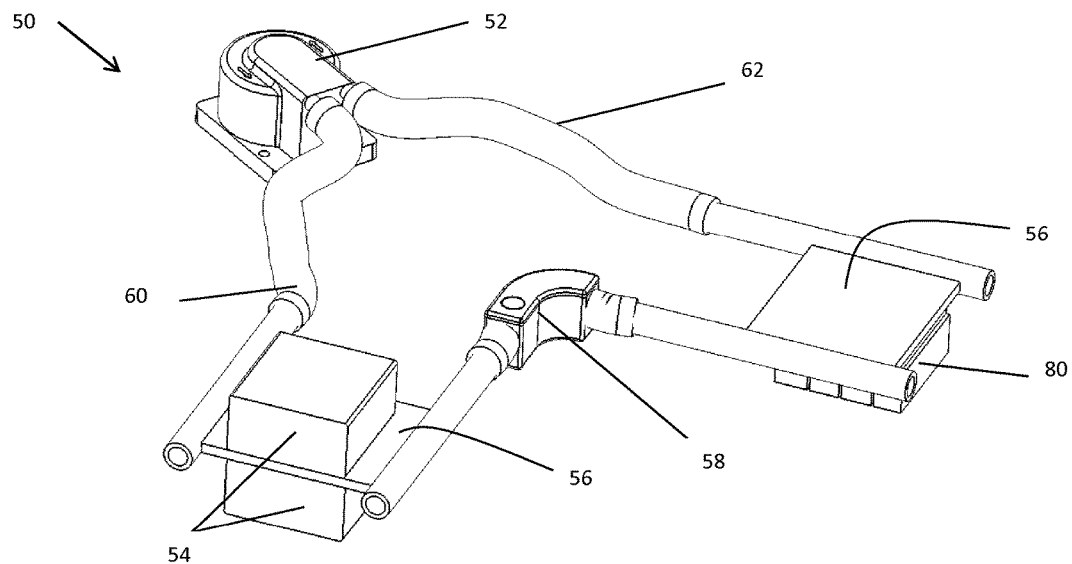
FIG. 7 illustrates the fluid lines and recirculation pump of the temperature conditioning module.

FIG. 7 illustrates the fluid circulation circuit 50. The fluid recirculation circuit 50 includes a pump 52 that moves fluid to the thermoelectric device 80 by a cooling line 62, then to the heat exchanger 54 through a waste heat line 58, and finally back to the pump 52 by the recirculation line 60. As illustrated the recirculation line 60 includes a fill port (not shown) for filling the fluid circulation circuit 50 although the fill port may be placed at any point along the fluid circulation circuit 50.

Figure 8:
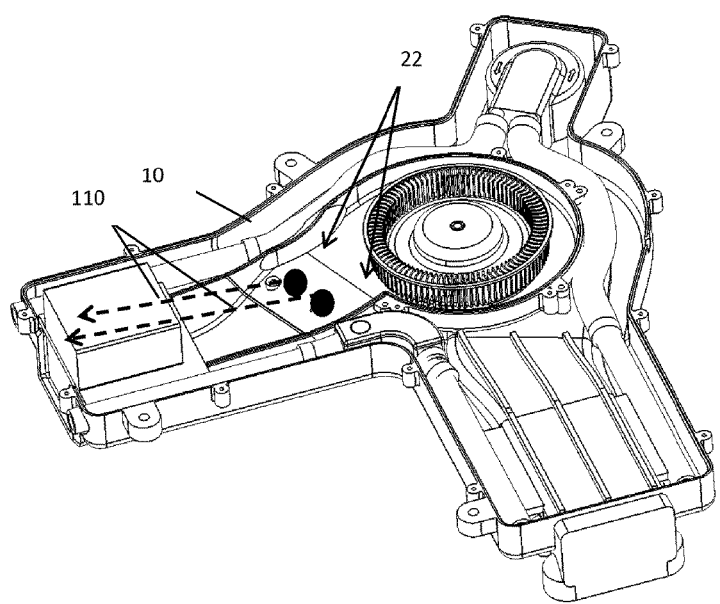
FIG. 8 illustrates the conditioning module including vents within the housing.

FIG. 8 illustrates a housing 10 including vents 22 that introduce air into possible dead spaces to encourage circulation of air in the direction 120 so that the entire module is cooled.

Any numerical values recited herein include all values from the lower value to the upper value in increments of one unit provided that there is a separation of at least 2 units between any lower value and any higher value. As an example, if it is stated that the amount of a component or a value of a process variable such as, for example, temperature, pressure, time and the like is, for example, from 1 to 90, preferably from 20 to 80, more preferably from 30 to 70, it is intended that values such as 15 to 85, 22 to 68, 43 to 51, 30 to 32 etc. are expressly enumerated in this specification. For values which are less than one, one unit is considered to be 0.0001, 0.001, 0.01 or 0.1 as appropriate. These are only examples of what is specifically intended and all possible combinations of numerical values between the lowest value and the highest value enumerated are to be considered to be expressly stated in this application in a similar manner.

Unless otherwise stated, all ranges include both endpoints and all numbers between the endpoints. The use of "about" or "approximately" in connection with a range applies to both ends of the range. Thus, "about 20 to 30" is intended to cover "about 20 to about 30", inclusive of at least the specified endpoints.

The disclosures of all articles and references, including patent applications and publications, are incorporated by reference for all purposes. The term "consisting essentially of" to describe a combination shall include the elements, ingredients, components or steps identified, and such other elements ingredients, components or steps that do not materially affect the basic and novel characteristics of the combination. The use of the terms "comprising" or "including" to describe combinations of elements, ingredients, components or steps herein also contemplates embodiments that consist essentially of the elements, ingredients, components or steps. By use of the term "may" herein, it is intended that any described attributes that "may" be included are optional.

Plural elements, ingredients, components or steps can be provided by a single integrated element, ingredient, component or step. Alternatively, a single integrated element, ingredient, component or step might be divided into separate plural elements, ingredients, components or steps. The disclosure of "a" or "one" to describe an element, ingredient, component or step is not intended to foreclose additional elements, ingredients, components or steps.

It is understood that the above description is intended to be illustrative and not restrictive. Many embodiments as well as many applications besides the examples provided will be apparent to those of skill in the art upon reading the above description. The scope of the teachings should, therefore, be determined not with reference to the above description, but should instead be determined with reference to the appended claims, along with the full scope of equivalents to which such claims are entitled. The disclosures of all articles and references, including patent applications and publications, are incorporated by reference for all purposes. The omission in the following claims of any aspect of subject matter that is disclosed herein is not a disclaimer of such subject matter, nor should it be regarded that the inventors did not consider such subject matter to be part of the disclosed inventive subject matter.

I claim:

1. A temperature conditioning module having an integrated waste heat cooling circuit, comprising:
 a housing having at least one air inlet and a first and second spaced apart air outlets, the first and second spaced apart air outlets defining terminal portions of respective first and second independent air passages;
 one or more motor driven impellers supported for rotation within the housing, the one or more motor driven impellers being in fluid communication with the at least one air inlet and one or both of the first and second air passages;
 one or more fluid recirculation pumps located within the housing;
 one or more thermoelectric devices that is located in the first passage of the housing between the one or more motor driven impellers and the first air outlet, the at least one thermoelectric device having a first main side and a second waste side and being adapted to generate a temperature gradient between the first main side and the second waste side upon application of a source of electricity;

one or more heat exchangers that are located in the second passage of the housing, between the at least one motor driven impeller and the second air outlet and a fluid circulation circuit that is (i) contained entirely within the housing, (ii) forms part of the housing or both (i) and (ii); the fluid circulation circuit being in fluid communication with the one or more fluid recirculation pumps, the one or more fluid recirculation pumps passing a fluid through:

a) one or more waste thermal transfer plates that are in thermal communication with the second waste side of the one or more thermoelectric devices to thereby absorb at least a portion of the waste heat provided by the second waste side of the one or more thermoelectric devices, and b) one or more heat exchange thermal transfer plates being located downstream of the one or more waste thermal transfer plates, the one or more heat exchange thermal transfer plates being in contact with the one or more heat exchangers to expel at least the portion of the waste heat from the one or more heat exchange thermal transfer plates to the heat exchanger before returning the fluid to the one or more fluid recirculation pumps for subsequent recirculation, wherein the fluid is a liquid;

wherein the one or more motor driven impellers is operable so that (i) air from the at least one air inlet is directed through the first passage in the housing and exits the first outlet after passing over the first main side of the one or more thermoelectric devices; and (ii) air from the at least one air inlet is directed through the second passage in the housing and exits the second outlet after passing over the one or more heat exchangers; and wherein the housing forms a single package that houses the one or more drive impellers, the one or more fluid recirculation pumps, the one or more thermoelectric devices, the one or more heat exchangers, the waste thermal transfer plate, the heat exchanger thermal transfer plate, and the fluid circulation circuit so that the single package is capable of being installed into an article of manufacture.

2. The temperature conditioning module of claim 1, wherein the fluid circulation circuit is a closed loop that continuously recirculates fluid.

3. The temperature conditioning module of claim 1, wherein the one or more motor driven impellers are two motor driven impellers and one motor driven impeller moves air across the one or more heat exchangers and one motor drive impeller moves air across the one or more thermoelectric devices.

4. The temperature conditioning device of claim 3, wherein the at least one air inlet is two opposing air inlets and each of the air inlets align with one of the two motor drive impellers.

5. The temperature conditioning module of claim 1, wherein the fluid is glycol, water, coolant, or a combination thereof.

6. The temperature conditioning module of claim 1, wherein the housing includes one or more vents that are angled towards the second outlet so that air entering the housing moves towards the second outlet allowing for circulation of air throughout the housing.

7. The temperature conditioning module of claim 6, wherein the one or more vents circulate air around the one or more motor driven impellers, air from areas with static air, or both.

8. The temperature conditioning module of claim 1, wherein the fluid circulation circuit includes one or more fill ports so that fluid can be added to the fluid circulation circuit.

9. The temperature conditioning module of claim 1, wherein the heat exchanger includes fins on both sides of the one or more heat exchanger thermal transfer plates.

10. The temperature conditioning module of claim 1, wherein the one or more waste thermal transfer plates include a plurality of fins.

11. The temperature conditioning module of claim 1, wherein the one or more waste thermal transfer plates, the one or more heat exchanger thermal transfer plates, or both are connected to the one or more thermoelectric devices, the one or more heat exchangers, or both respectively by a conductive adhesive, a thermal grease, solder, or a combination thereof.

12. The temperature conditioning module of claim 1, wherein the one or more fluid recirculation pumps are off when the thermoelectric device generates heat so that fluid in the fluid circulation circuit is not circulated and the one or more fluid recirculation pumps are on when the thermoelectric device generates cold so that fluid in the fluid recirculation circuit is circulated.

13. The temperature conditioning module of claim 1, wherein the fluid circulation circuit includes a plurality of pipes that extend from the one or more fluid recirculation pumps to the one or more waste thermal transfer plates, to the one or more heat exchanger thermal transfer plates, and then to the one or more fluid recirculation pumps so that a fluid circuit is created by the plurality of pipes.

14. The temperature conditioning module of claim 1, wherein the temperature conditioning module is free of any connection to a fluid source.

15. The temperature conditioning module of claim 1, wherein the temperature conditioning module includes one or more electrical connections that power the one or more motor driven impellers.

16. The temperature conditioning module of claim 1, wherein the temperature conditioning module is connected to a climate control system for distributing conditioned air from the temperature conditioning module.

17. The temperature conditioning module of claim 1, wherein the temperature conditioning module is part of a vehicle seat.

18. The temperature conditioning module of claim 1, wherein air passed over the one or more thermoelectric devices changes temperature by about 10 degrees or more.

19. The temperature conditioning module of claim 1, wherein the one or more waste thermal transfer plates and the one or more thermoelectric devices and the one or more heat exchange thermal transfer plates and the one or more heat exchangers are sandwiched within the housing.

* * * * *